(12) United States Patent
Bellessort et al.

(10) Patent No.: US 7,868,793 B2
(45) Date of Patent: Jan. 11, 2011

(54) METHODS AND DEVICES FOR CODING AND DECODING OF SML TYPE DOCUMENTS BY SIMILARITIES

(75) Inventors: Romain Bellessort, Rennes (FR); Hervé Ruellan, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 28 days.

(21) Appl. No.: 12/496,280

(22) Filed: Jul. 1, 2009

(65) Prior Publication Data

US 2010/0001886 A1    Jan. 7, 2010

(30) Foreign Application Priority Data

Jul. 2, 2008    (FR)    ................... 08 54480

(51) Int. Cl.
*H03M 7/00*    (2006.01)
(52) U.S. Cl. ................... 341/107; 358/535; 382/237
(58) Field of Classification Search ............ 341/50–90, 341/107, 152–167; 358/535; 382/237, 173, 382/307; 235/494, 454
See application file for complete search history.

(56) References Cited

U.S. PATENT DOCUMENTS

| | | | | |
|---|---|---|---|---|
| 5,300,930 A * | 4/1994 | Burger et al. | ................. | 341/96 |
| 5,764,166 A * | 6/1998 | Yoshimura et al. | ............ | 341/58 |
| 6,052,077 A * | 4/2000 | Ogasawara | ................. | 341/161 |
| 6,262,676 B1 * | 7/2001 | King | ............ | 341/96 |
| 6,628,215 B2 * | 9/2003 | Talwar et al. | ................. | 341/107 |
| 6,696,990 B2 * | 2/2004 | Pascucci | ................. | 341/55 |
| 6,819,271 B2 | 11/2004 | Geiger et al. | ................. | 341/51 |
| 7,128,270 B2 * | 10/2006 | Silverbrook et al. | ... | 235/472.01 |
| 7,234,645 B2 * | 6/2007 | Silverbrook et al. | ........ | 235/494 |
| 2006/0069857 A1 | 3/2006 | Lekatsas et al. | ............ | 711/108 |
| 2008/0098029 A1 | 4/2008 | Ruellan | ................. | 707/102 |
| 2008/0129556 A1 | 6/2008 | Garakani et al. | ............ | 341/51 |
| 2008/0250055 A1 | 10/2008 | Ruellan et al. | ............ | 707/102 |
| 2009/0138529 A1 | 5/2009 | Bellessort | ................. | 707/203 |
| 2009/0254882 A1 | 10/2009 | Ruellan | ................. | 717/120 |

OTHER PUBLICATIONS

Salomon, David, "Data Compression", *Springer Verlag*, London, GB, pp. 26-27 (2007).

* cited by examiner

*Primary Examiner*—Lam T Mai
(74) *Attorney, Agent, or Firm*—Fitzpatrick, Cella, Harper & Scinto

(57) ABSTRACT

The invention relates to methods and devices for binary coding and decoding by similarities for structured documents After having decomposed the data to code into a series of symbols, each item of data being at least partially represented by a symbol, and having selected at least one item of data to code, a search is carried out for a first sequence of symbols coded beforehand, identical to a second sequence of symbols to code, comprising a symbol representing a part of said data. Similarly, a search is carried out for a third sequence of symbols coded beforehand of which one symbol is distinct from the symbol corresponding to a fourth sequence of symbols to code comprising said symbol representing said part of said data. In response to the comparison of their coding efficiency, the second or the fourth sequence is coded.

25 Claims, 7 Drawing Sheets

METHODS AND DEVICES FOR CODING AND DECODING OF SML TYPE DOCUMENTS BY SIMILARITIES

The present invention concerns the optimization of files of XML type and more particularly methods and devices for coding and decoding of XML type documents by similarities, in particular documents of SVG type.

XML (acronym for Extensible Markup Language) is a syntax for defining computer languages. XML makes it possible to create languages that are adapted for different uses but which may be processed by the same tools.

An XML document is composed of elements, each element starting with an opening tag comprising the name of the element, for example, <tag>, and ending with a closing tag which also comprises the name of the element, for example, </tag>. Each element can contain other elements or text data.

An element may be specified by attributes, each attribute being defined by a name and having a value. The attributes are placed in the opening tag of the element they specify, for example <tag attribute="value">.

XML has numerous advantages and has become a standard for storing data in a file or for exchanging data. XML makes it possible in particular to have numerous tools for processing the files generated. Furthermore, an XML document may be manually edited with a simple text editor. Moreover, an XML document, containing its structure integrated with the data, is very readable even without knowing the specification.

However, the main drawback of the XML syntax is to be very prolix. Thus, the size of an XML document may be several times greater than the inherent size of the data. This large size of XML documents thus leads to a long processing time when XML documents are generated and especially when they are read.

To mitigate these drawbacks, mechanisms for coding XML documents have been sought. The object of these mechanisms is to code the content of the XML document in a more efficient form but enabling the XML document to be easily reconstructed.

The appellation binary XML designates the techniques for compressing XML data. These techniques aim in particular to reduce the size of the XML data, which are often voluminous and redundant, as well as to make the access to those data faster.

To compress XML data, the compression of the structure should be distinguished from the compression of the data themselves. For example, if a set of XML data represents a list of books, a structure comprising elements of type "book", "author" and "title" may be used. The structure is generally repeated and may therefore be easily compressed. On the other hand, the data are generally less redundant. For example, in a list of books, there is little chance of finding the same title several times but it is possible that the same author appears several times.

In order to compress the data, the most common technique consists of listing the various strings and of replacing the repeated strings by a reference. However, cases exist for which it is advantageous to use a code that is specific to the strings processed. Thus, for example, if Boolean values have to be coded, it is possible to use only one bit to represent them. Similarly, if numbers between 0 and 255 are coded, only one byte is needed.

Thus, for example, LZ77 is a data compression algorithm which replaces sequences of symbols by references to sequences of symbols already coded. If a sequence "abcd" is to be coded and has already been identified twenty characters earlier, a reference composed of a shift ("20") and a length ("4") is coded. LZ77 only identifies sequences that are identical.

The SVG data format (SVG being an acronym for Scalable Vector Graphics) is an XML language enabling vectorial graphics to be described. SVG uses the XML format and defines a set of elements and attributes making it possible in particular to describe geometric shapes, transformations, colors and animations.

A much used tool in SVG is the graphics path. A graphics path is a set of commands and associated coordinates, making it possible to describe a complex graphics form on the basis of segments, Bezier curves and circle arcs.

Binary XML formats may be used to code SVG documents. However, most of these formats have limitations with regard to the coding of SVG documents. This is because, in numerous SVG documents, the proportion of structure is small relative to the proportion of content. However, binary XML formats are mainly directed to compressing the structure of XML documents. In relation to content, binary XML formats can index the values, in order not to code several times the same value that is repeated in the content. They may also code, in a specific way, certain contents of which the type is known and simple, for example an integer or a real number. But SVG contents satisfy none of these criteria: SVG contents which are large in size are rarely repeated and generally do not correspond to simple types. These contents of large size are for example graphics paths, which mix simple graphics commands with coordinates or lists of integer or real values.

For this reason, it is necessary to create new binary XML formats that are specific to SVG documents or to adapt existing binary XML formats to efficiently code SVG documents.

The patent U.S. Pat. No. 6,624,769 describes a binary XML format adapted to code SVG documents. This patent describes in particular a specific way to code SVG paths consisting of coding the commands used in the path and only attributing a code to the commands present in the path. Furthermore, these codes are Huffman type codes, of which the attribution is predefined for all the existing commands.

The command arguments are coded in binary manner, using a minimum number of bits enabling any argument present in the path to be coded. More precisely, the patent is limited to the coding of integer arguments, corresponding to the SVG profiles for mobile telephones, and separates the arguments into two categories: the arguments corresponding to absolute commands and those corresponding to relative commands. In the case of an absolute command, the argument directly represents a position in the SVG reference frame whereas in the case of a relative command, the argument represents the movement from the previous position. For each type of argument, calculation is made of the minimum number of bits enabling any argument of that type present in the path to be coded. Next, each argument is coded over a number of bits depending on its type.

The format described in this patent enables compact SVG documents to be obtained, but only applies to a restricted category of documents and is still of limited efficacy in the case of large paths.

Furthermore, a type of coding which may be used to code a series of numbers is coding by dictionary wherein the set of values taken by the different numbers is first coded. This set of values constitutes a dictionary which is used to code the numbers. Thus, for each number, the index of that number in the dictionary is coded.

Such a type of coding is generally efficient for SVG values.

Another type of coding which may be used to code a series of numbers is coding by difference, also termed coding by delta, in which each number is coded not directly, but relative to the preceding one. Thus, for each number, the difference between that number and the preceding one is coded. This system is efficient in the case of series of number of which the variation is small relative the value of the number.

In the case of SVG, this type of coding is partially integrated into the language on account of the existence of the relative commands. Moreover, the variations between two successive numbers are often of the same order of magnitude as the numbers themselves. Lastly, in the case of paths, two successive numbers represent values corresponding to two different coordinates, which are thus relatively independent.

Consequently, there is a need to improve the coding of a series numbers that is adapted. The invention enables at least one of the problems set out above to be solved, and, in particular, makes it possible to increase the efficiency of compressing series of data, in particular series of numbers, and notably data of SVG type.

The invention thus relates to a method of binary coding by similarities for a structured document comprising at least one plurality of data to code, the method comprising the following steps, decomposing said plurality of data to code into a series of symbols, each item of data of said plurality of data being at least partly represented by a symbol of said series of symbols;

selecting at least one item of data in said plurality of data to code;

searching for at least one first sequence of symbols coded beforehand, said first sequence being identical to a sequence of symbols to code, termed second sequence, comprising at least one symbol representing at least one part of said at least one selected item of data, termed processed symbol;

searching for at least one third sequence of symbols coded beforehand, at least one symbol of said third sequence being distinct from the symbol corresponding to a sequence of symbols to code, termed fourth sequence, comprising at least said at least one processed symbol;

comparing the coding efficiency of said second and fourth sequences, said second and fourth sequences being coded relatively to said first and third sequences, respectively; and, in response to said comparison, coding said second sequence or said fourth sequence.

The method according to the invention thus makes it possible to optimize the coding of structured documents such as XML documents, in particular documents of SVG type, by comparing several possible coding forms, in particular by combining coding of the "coding by identical references" type and of the "coding by references with at least one difference" type. The method thus provides a parallel search for sequences of identical symbols and for sequences of close symbols, comprising at least one difference, as well as the selection of the best sequence for coding from among the identified sequences.

Advantageously, the method further comprises a step of comparing said at least one processed symbol with a plurality of symbols coded beforehand and a step of selecting a symbol coded beforehand, identical to said at least one processed symbol, said selected symbol belonging to said first sequence, to identify sequences of identical symbols.

Similarly, the method further comprises, preferably, a step of comparing said at least one processed symbol with a plurality of symbols coded beforehand and a step of selecting a first symbol coded beforehand, close to said at least one processed symbol, said selected symbol belonging to said third sequence, to identify sequences of close symbols.

According to a particular embodiment, the method further comprises a step of grouping together the symbols coded beforehand to improve the identification of the sequences of identical and close symbols, the coded symbols being grouped such that the symbols of the same group are close to each other. For example, said grouping step comprises a step of grouping by prefix or a step of grouping by prefix and by length of the prefix.

Still according to a particular embodiment, the method further comprises a step of selecting a first sequence from a plurality of sequences satisfying the search criterion for said at least one first sequence, prior to said step of comparing the coding efficiency of said second and fourth sequences.

Similarly, still according to a particular embodiment, the method further comprises a step of selecting a third sequence from a plurality of sequences satisfying the search criterion for said at least one third sequence, prior to said step of comparing the coding efficiency of said second and fourth sequences.

The method according to the invention thus makes it possible to optimize the coding of structured documents by comparing the efficiency of several forms of coding of the same type. The criteria for comparison are for example the length of the sequences. It is thus possible to compare the efficiency of several forms of coding of the same type without performing any calculation.

Said step of selecting a sequence from a plurality of sequences, or at least one of said steps of selecting a sequence from a plurality of sequences, advantageously comprises a step of determining the distance between the position of the first symbol of each of the sequences of said plurality of sequences and the position of said processed symbol and a step of comparing said distance with a predetermined threshold. The method according to the invention thus makes it possible to select sequences situated near the processed symbol according to the sliding search window principle.

Still according to a particular embodiment, at least one item of data from said plurality of data is a decimal number (i.e. a real number having an integer part and possibly a decimal or fractional part), the integer part of said decimal number being represented by a first symbol and the decimal part of said decimal number being represented by a second symbol. The method thus makes it possible to optimize the processing and the coding of the data to code. Similarly, the sign of a number is advantageously represented by a first symbol, the absolute value of the number being represented by at least one second symbol.

Still according to a particular embodiment, the method further comprises a prior step of re-organizing the data of said plurality of data according to the nature of said data in order to code the data more efficiently by imposing tighter constraints on the data by distinguishing, for example, commands from numbers.

Said step of comparing the coding efficiency of said second and fourth sequences advantageously comprises a step of comparing the amount of data represented by said second and fourth sequences before and after coding to enable the most efficient coding to be chosen on the basis of, in particular, the compression ratio.

The invention also relates to a method of binary decoding for a structured document comprising at least one plurality of coded data, the method comprising the following steps, obtaining said plurality of coded data, said data being coded according to the method described above;

selecting at least one item of coded data in said plurality of coded data;

determining the coding format of said at least one selected item of data from a plurality of predetermined coding formats, at least one coding format being of the "coding by identical references" type and at least one coding format being of the "coding by references with at least one difference" type; and, in response to said determining step, decoding said at least one selected item of data according to a list of symbols comprising at least one item of data decoded beforehand.

The invention thus makes it possible to decode structured documents such as XML documents, in particular documents of SVG type, coded in improved manner by comparison of several possible forms of coding, in particular forms of coding of the "coding by identical references" type and of the "coding by references with at least one difference" type.

Advantageously, the method further comprises a step of adding decoded data during said decoding step to said list of symbols enabling the decoding of following data.

The invention also relates to a computer program comprising instructions adapted for the implementation of each of the steps of the method described earlier as well as an information storage means, removable or not, that is partially or totally readable by a computer or a microprocessor containing code instructions of a computer program for executing each of the steps of the method described earlier.

The invention also relates to a device for binary coding by similarities for a structured document comprising at least one plurality of data to code, the device comprising the following means, means for decomposing said plurality of data to code into a series of symbols, each item of data of said plurality of data being at least partly represented by a symbol of said series of symbols;

means for selecting at least one item of data in said plurality of data to code;

means for searching for at least one first sequence of symbols coded beforehand, said first sequence being identical to a sequence of symbols to code, termed second sequence, comprising at least one symbol representing at least one part of said at least one selected item of data, termed processed symbol;

means for searching for at least one third sequence of symbols coded beforehand, at least one symbol of said third sequence being distinct from the symbol corresponding to a sequence of symbols to code, termed fourth sequence, comprising at least said at least one processed symbol;

means for comparing the coding efficiency of said second and fourth sequences, said second and fourth sequences being coded relatively to said first and third sequences, respectively; and, means for coding said second sequence or said fourth sequence in response to said comparison.

The device according to the invention thus makes it possible to optimize the coding of structured documents such as XML documents, in particular documents of SVG type, by comparing several possible forms of coding, in particular by combining coding of the "coding by identical references" type and of the "coding by references with at least one difference" type. The device thus makes it possible to perform a parallel search for sequences of identical symbols and for sequences of close symbols, comprising at least one difference, as well as to select the best sequence for coding from among the identified sequences.

According to a particular embodiment, the device further comprises means for comparing said at least one processed symbol with a plurality of symbols coded beforehand and means for selecting a first symbol coded beforehand, identical to said at least one processed symbol, said selected symbol belonging to said first sequence, to identify sequences of identical symbols.

Still according to a particular embodiment, the device further comprises means for comparing said at least one processed symbol with a plurality of symbols coded beforehand and means for selecting a first symbol coded beforehand, close to said at least one processed symbol, said selected symbol belonging to said third sequence, to identify sequences of close symbols.

Advantageously, the device further comprises means for grouping together symbols coded beforehand to improve the identification of the sequences of identical and close symbols. According to a particular embodiment, said grouping means are adapted to group together symbols coded beforehand by prefix or by prefix and by length of prefix.

Still according to a particular embodiment, the device further comprises means for re-organizing the data of said plurality of data according to the nature of said data in order to code the data more efficiently by imposing tighter constraints on the data by distinguishing, for example, commands from numbers.

Advantageously, said means for comparing the coding efficiency of said second and fourth sequences comprise means for comparing the amount of data represented by said second and fourth sequences before and after coding to enable the most efficient coding to be chosen on the basis of, in particular, the code rate.

Advantageously, the device further comprises means for selecting a sequence from a plurality of sequences in order to select said first and/or said third sequence, said selecting means comprising means for determining the distance between the position of the first symbol of each of the sequences of said plurality of sequences and the position of said processed symbol and means for comparing said distance with a predetermined threshold. The device according to the invention thus makes it possible to select sequences situated near the processed symbol on the basis of the sliding search window principle.

The invention also relates to a device for binary decoding for a structured document comprising at least one plurality of coded data, the device comprising the following means, means for obtaining said plurality of coded data, said data being coded in conformity with the device described above;

means for selecting at least one item of coded data in said plurality of coded data;

means for determining the coding format of said at least one selected item of data from a plurality of predetermined coding formats, at least one coding format being of the "coding by identical references" type and at least one coding format being of the "coding by references with at least one difference" type;

means for decoding said at least one selected item of data according to a list of symbols comprising at least one item of data decoded beforehand; and, means for adding to said list of symbols the data decoded by said decoding means.

The invention thus makes it possible to decode structured documents such as XML documents, in particular documents of SVG type, coded in improved manner by comparison of several possible forms of coding, in particular forms of coding of the "coding by identical references" type and of the "coding by references with at least one difference" type.

Other advantages, objects and features of the present invention will emerge from the following detailed description, given by way of non-limiting example, relative to the accompanying drawings in which.

Figure 1:
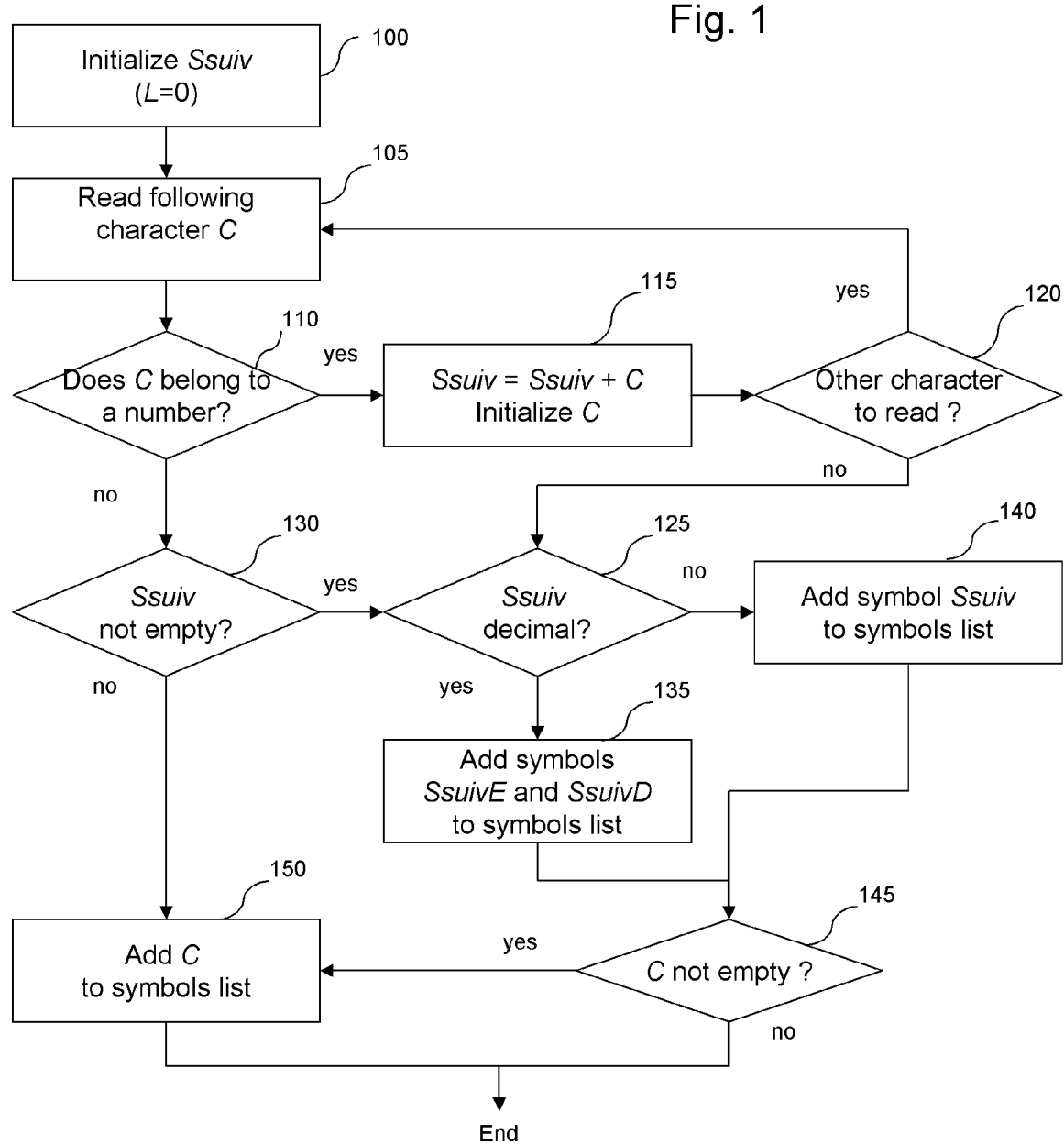
FIG. 1 illustrates an algorithm example for reading symbols when there remains at least one character to read in the data to code.

Generally, the invention concerns first of all identifying the numbers in the data to code. Next, for each number, the coding efficiency or the coding cost for that number is determined using a default coding, which fully describes the number. Then, for the number considered, close numbers are searched for from among the numbers already coded. If a close number is identified, the numbers which follow the number considered and the numbers which follow each close number are compared. Thus, sequences of similar numbers are determined. In particular, strictly identical sequences (for example two occurrences of the string "10 20 30") and sequences comprising at least one difference (for example "10" and "11" or "10 20" and "10 21") are determined. The different solutions for coding are then compared in terms of coding efficiency and the most efficient solution is chosen. The numbers are thus coded individually or by sequence according to the coding efficiency.

It should be noted that, for the sake of clarity, the following description essentially concerns the coding of numbers. However, the invention may also apply to the coding of other data representing other types of information if it is possible to calculate a difference between the elements of such data. Thus, if the elements to be coded are words, the difference between two words may be determined by the letters to modify to pass from one to the other. In such a case, coding the word "met" on the basis of the word "mot" may be performed efficiently by indicating in the coding by difference that the second letter is "e".

The invention uses the concept of sequence of symbols, the symbols being obtained by decomposing the data to code (result of the reading of the data to code). A sequence here designates a series of symbols. Several types of sequences may be used.

The sequences may be described using several parameters. All the descriptions of sequences advantageously comprise an index for the beginning or start of the sequence and a length, that is to say the number of symbols in the sequence. Other parameters may be used according to the type of sequence.

A sequence called "Number" simply represents a number. It is characterized by a beginning index and a length L which may here take the value 1 or 2 according to whether the number is an integer or decimal and if it is considered that a decimal number is represented by two symbols. This type of sequence is different from the others in that it does not make reference to other symbols. By default, the symbols are coded in Number type sequence form.

For this type of coding, it is advantageous to code the small integer numbers over a single byte, for example the numbers between 0 and 31.

A sequence termed "Match" enables two series of identical symbols to be referenced. It is characterized by a starting index, a reference index and a length L. The L symbols following the starting index are identical to the L symbols following the reference index.

A sequence termed "Delta" makes it possible to represent at least one number, in the form of a series of symbols (a number may be considered as one or two symbols according to the representation used for decimal numbers), on the basis of a reference value and a difference value termed delta. A typical sequence of Delta type only concerns a single number. It thus makes it possible to code the index of the reference number as well as the difference. Alternatively, the sequence may cover several numbers by coding the difference between each of those numbers and the reference value. Again alternatively, the sequence may cover several numbers by coding the difference between those numbers and reference values (using as many reference values as numbers).

Generally, such a sequence is characterized by a starting index, a reference index, a length L and at least one difference.

It is advantageous, for a sequence of Delta type, to code the difference over a single byte, such a difference then representing a small variation relative to the preceding number.

A sequence termed "MatchDelta" is here composed of a sequence of Match type then a series of differences, each of those differences enabling a number to be determined following on from the sequence of Match type. For example, considering the sequences "120 30 50 75" and "120 30 60 80", the second sequence may be described with a MatchDelta sequence with reference to the first using the Match sequence for the part "120 30" and the two deltas having the values 10 and 5 for the part "60 80".

Other definitions of sequences may also be used.

For a given type of sequence, different coding formats may be defined. These formats are all the more relevant that the hypotheses on the data to process are precise. By way of illustration, the example given in the following portion of the description provides a coding format for each type of sequence. In this example, and more generally in the description, the size of the coded data is expressed in terms of bytes. However, it should be noted that the method may be implemented using coding in non-aligned bytes, that is to say by using a variable number of bits to code the symbols. For example, 6 bits may be used to code a first symbol, then 4 bits for another, 14 bits for a third and so forth. In this manner, the code for a symbol does not necessarily commence at the start of a byte.

As indicated earlier, the knowledge of hypotheses as to the data to code enables more efficient forms of coding to be defined. An application of this principle consists of modifying the coding used depending on the type of data to code. If, for example, it is known that the data processed represent a series of close numbers, it is worthwhile to give precedence to coding in the form of sequences of delta type. An efficient manner of improving the forms of coding consists of modifying the headers used, for each type of sequence, for example depending SVG element and attribute coded, to optimize the referencing of the types of sequences.

It is remarked here, in the example illustrated in the description below, that the series of differences are identified by bytes commencing with the bits "001". If it is chosen only to use a single bit, two bits may be used for the coding of the series of differences, which makes it possible, for example, to code four times more values over the same number of bytes.

Different sequences of the same type may be compared with each other, as regards their coding efficiency, by virtue of the parameters defining them. Thus, if sequences of Match type are searched for, their length may be used to compare them. Precedence is given to the longest sequence since it enables more symbols to be coded using a single representation. For sequences of Delta type, precedence is given to the differences of smaller values since they may be coded more compactly.

However, to compare several sequences of different types, for example a sequence of Match type and a sequence of Delta type, with regard to their coding efficiency, another measure of coding efficiency is needed. Such a measure is, for example, linked to the number of characters represented by the sequence and to the number of bytes necessary for the coding of that sequence. A simple criterion then consists of comparing the ratios representing the number of characters and the number of bytes, for each of the sequences. The highest ratio makes it possible to determine the most advantageous sequence for the compression of the data.

It is also possible to take into account a criterion of length. If the ratios are equal, the shortest sequence or the longest (in number of characters) is selected according to the value of the ratio. For these purposes, it is necessary to determine a limit ratio, which may for example be the average ratio between the number of characters represented and the number of bytes coded. This value varies according to the data. The value two may be used, which means that above two characters per byte, it is considered that the sequence is advantageous whereas below it is not. A lower ratio, for example a ratio between 1.5 and 2, is a normal result for coding based only on sequences of Number type.

This type of threshold may also be used to calculate an absolute gain which enables the length of the coded data to be taken into account. This is because, if the ratio of the number of characters and the number of bytes of the sequence is slightly less than that of another sequence but enables more characters to be coded and that ratio is greater than the threshold, it may be in more advantageous to choose the sequence having the lowest ratio.

By way of illustration, if a sequence gives a ratio of 4.9 over 30 characters and another sequence gives a ratio of 5 over 10 characters, it may be considered in more advantageous to choose the sequence of ratio 4.9. To compare two sequences, it is thus possible to calculate, for the shortest sequence, the ratio which would be obtained if the characters present in the longest sequence but not in the shortest were coded with that limit ratio. In the example, there are 20 characters "missing" from the shortest sequence. If those 20 characters were coded with 2 characters per byte, 10 bytes would thus be need, i.e. 12 bytes to code as much data as with the sequence of ratio 4.9. The ratio 30/12 is less than 4.9. The sequence of ratio 4.9 is thus chosen.

FIG. 1 illustrates an algorithm example for reading a symbol when there remains at least one character to read in the data to code.

A string, termed Ssuiv, serving to store the characters composing a symbol, is first of all initialized by setting its length here, termed L, to zero (step 100). The character following the data to code is then obtained and stored in a variable C (step 105). An evaluation is then made to determine whether that character belongs to a number (step 110), that is to say whether it is a figure or a point. It is to be recalled that a point is used in SVG strings to separate the integer part from the decimal part of a number.

The signs are not considered here as belonging to numbers. They constitute symbols in their own right. In this manner, all the numbers identified are positive numbers and it is not therefore necessary to take into account the signs to compare numbers. Alternatively, the numbers could be signed, the comparisons then being made in absolute value. Furthermore, to consider the signs as distinct symbols does not prevent them from being efficiently coded. According to a particular embodiment, the signs are not coded as separate symbols. Their coding is grouped with that of the number and may be made over a single bit.

It is remarked here that the identification of the numbers via symbols to find series of identical characters in the data to code makes it possible to reduce the number of comparisons made. Thus, contrary to what is done in a systematic search based on characters, each character is not compared with all the characters coded previously. A targeted search, directed to the symbols representing numbers and not characters, is made. Although certain series of identical characters may be ignored with this method, it makes it possible to find the longest sequences corresponding to repetitions of numbers. Furthermore, if a repetition does not cover a number, this means that the repetition only concerned a part of the number which is rarely advantageous from the point of view of the coding, since it may be assimilated to the loss of synchronization with the series of numbers.

If the character stored in C belongs to a number, it is added to the symbol Ssuiv by concatenation (step 115) in order to obtain the number accessed in the symbol Ssuiv. The variable C is then initialized and the length of the symbol L is incremented by one. A test is then carried out to determine whether a character to read remains in the data to code (step 120). If a character remains to read, the preceding steps are repeated to read the next character. If no character remains to be read, that is to say if all the data to code have been read, a test is carried out to determine whether the symbol Ssuiv represents a decimal number (step 125).

Similarly, if the character stored in C does not belong to a number (step 110) and if the symbol Ssuiv is not empty (step 130), that is to say if its length is not null, a test is carried out to determine whether the symbol Ssuiv represents a decimal number (step 125).

If the symbol Ssuiv represents a decimal number, two symbols, termed SsuivE and SsuivD, are added to the list of the symbols (step 135). SsuivE represents the integer part of the number represented by the symbol Ssuiv whereas SsuivD represents the decimal part of the number. SsuivD comprises the point separating the integer and decimal parts.

If the symbol Ssuiv does not represent a decimal number, the symbol Ssuiv, representing an integer number, is added to the list of the symbols (step 140).

When a symbol is added to the list of the symbols, its position in the data to code is stored in memory. In the case of a number, its position as a number is also stored. It should be noted that the use of two symbols to represent a decimal number is not required by the invention, it is simply an optimization enabling finer granularity of the symbols to be obtained and thus to potentially find more sequences of identical symbols.

After having added the symbol Ssuiv or the symbols SsuivE and SsuivD to the list of the symbols, a test is carried out to determine whether the character C is not empty (step 145), that is to say to determine whether the character C does not represent the last character of the data representing a number.

If the character C is not empty (step 145), it is added as a symbol to the list of the symbols (step 150).

Similarly, if the character C does not belonging to a number (step 110) and if the symbol Ssuiv is not empty (step 130), the character C is added as a symbol to the list of the symbols (step 150).

The algorithm for reading a symbol then ends and results in a decomposition of the plurality of the numbers forming part of the data to code into a list or series of symbols. Each number is represented by one or two symbols, depending on whether it is an integer number or a decimal number.

It should be noted that before reading the data as described with reference to FIG. 1, it is possible to apply to them prior processing of which the object may be to increase the probability of finding advantageous sequences to code. In particular, the SVG paths are constituted by commands and values, that is to say numbers, it being possible for each command to be in absolute coordinates (upper case command, for example M) or in relative coordinates (lower case command, for example m). As a general rule, data in relative coordinates are less voluminous that data in absolute coordinates. Consequently, a processing operation may consist of transforming the absolute commands into relative commands.

Another processing operation may consist of grouping together all the commands at starts of strings, then all the numbers. Thus, the data to code are not represented by a single string in which the symbols may be commands or numbers but by a first string composed of commands and a second composed of numbers. It is thus possible to more efficiently code the commands and the numbers. Knowing the number of values to read for each command, it is possible to reconstitute the initial data.

A prior processing operation may also consist of deleting the characters not representing information with regard to SVG such as line feeds and tabulations, solely intended to make the data more readable in a text editor. For SVG data, the fact of preserving the starting string exactly is not essential. It is the information relative to SVG that should be kept in order to obtain the same graphical representation of the data.

Lastly, it should be noted that it is not always necessary to add all the symbols read to the list of the symbols to process. More particularly, if it is decided not to code the separators, their presence in the list of the symbols to code is superfluous since, when the numbers are in the list of symbols to code, they are arranged to be separated from each other.

Figure 2:
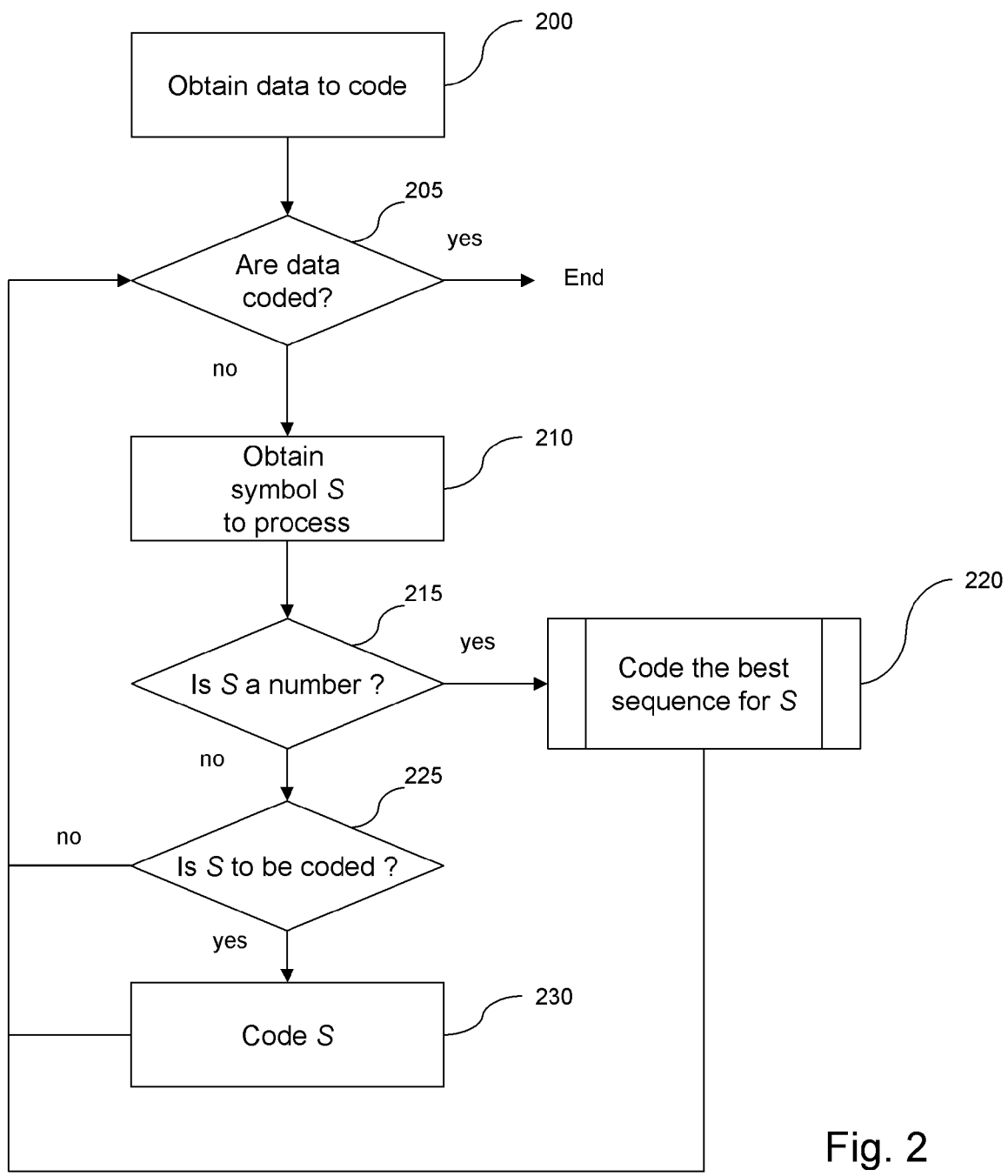
FIG. 2 illustrates an algorithm example for binary coding by similarity of the data.

FIG. 2 illustrates an algorithm example for binary coding by similarities of the data.

After having obtained the data to code (step 200), a test is carried out to determine whether those data have been fully coded (step 205).

If the data have not been fully coded, the following symbol S to code is obtained (step 210). If the symbols have been already read but not yet coded, the first of them is the following symbol to process otherwise the next symbol is read using, for example, the algorithm described previously with reference to FIG. 1. Thus, an item of data to code, which is a number in this example, is selected from the plurality of the data to process.

A test is then carried out to determine whether the symbol S represents a number (step 215). If the symbol S represents a number, the best sequence for coding representing the symbol S is determined (step 220). Step 200 is described in detail with reference to FIG. 3.

If the symbol S does not represent a number, a test is carried out to determine whether the symbol S must be coded (step 225). This is because, in this case, S is just a character and not all the characters have to be coded. For example, the sign of a number is preferably not coded since it is advantageously coded with the number which follows it. Similarly, a separator, typically the space which follows a number, is not necessarily coded since it may be considered that any number is implicitly followed by a separator. On the other hand, in the case of an SVG command, for example a command "M" or "c", the symbol is coded. The coding of a symbol S (step 230) consists here of writing in the codestream the code associated with the symbol S, for example a code over a byte.

If the symbol S does not have to be coded (step 225), after having coded the symbol S (step 230) or after having determined the best coding for the symbol S (step 220), the algorithm loops to step 205 at which a test is carried out to determine whether the data have been fully coded. When the data have been fully coded, the algorithm ends.

Figure 3:
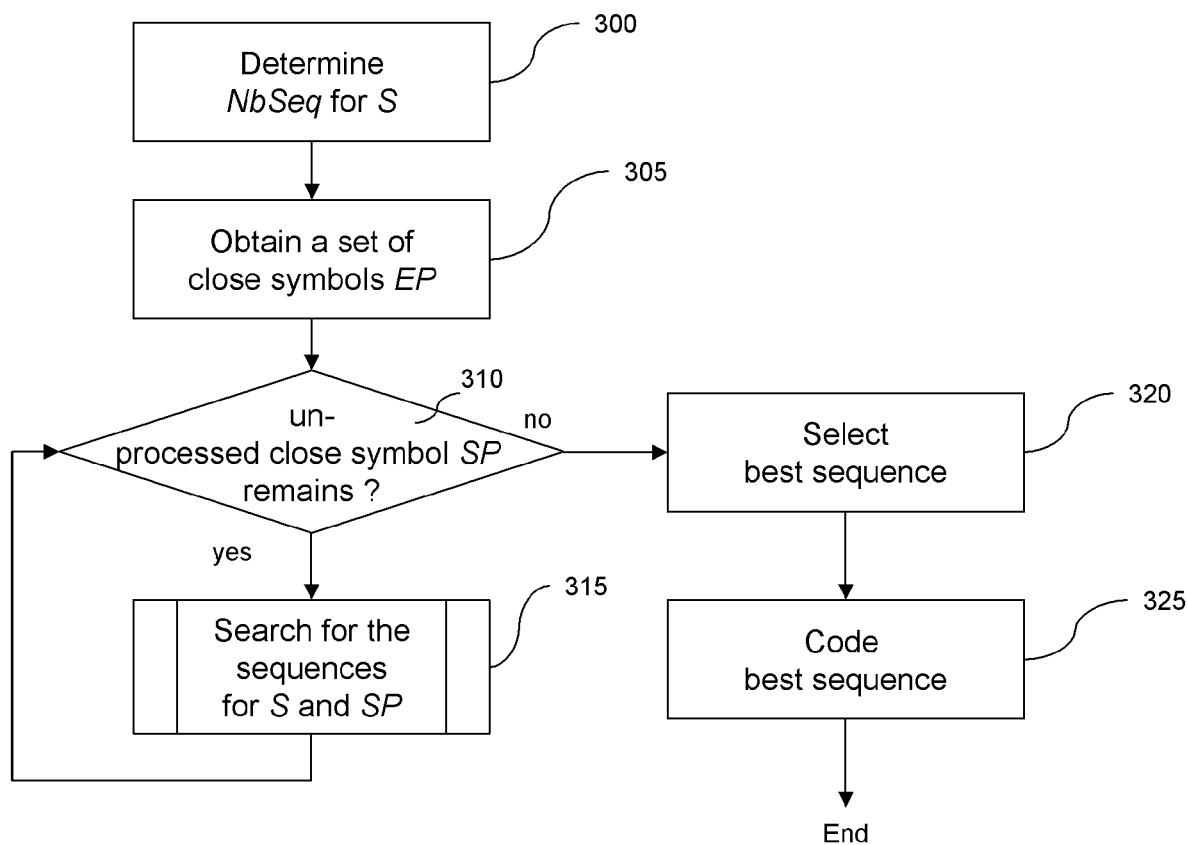
FIG. 3 illustrates an algorithm example used for determining the best coding sequence for a symbol S.

FIG. 3 illustrates an algorithm example used for determining the best coding sequence for a symbol S.

When a numerical symbol S is coded, it is necessary to seek to determine several types of sequences for that symbol S and the symbols which follow it to choose the sequence permitting the most efficient coding.

Thus, for example, after having determined a sequence of Match type and a sequence of Delta type, the coding efficiency for these sequences is compared to determine the most adapted coding format.

In other words, after having determined at least one first sequence of symbols coded beforehand, identical to a second sequence of symbols to code comprising the symbol S, and at least one third sequence of symbols coded beforehand of which at least one symbol is distinct from the symbol corresponding to a fourth sequence of symbols to code comprising the symbol S, the comparison of the coding efficiency of the second and fourth sequences of symbols makes it possible to identify the most appropriate coding for the symbol S. The symbol S is coded by coding of the second or fourth sequence.

The object of a first step is the determination of the sequence of number type, termed NbSeq, for the symbol S, according to the definition given previously.

The set EP of the symbols close to the symbol S is next obtained (step 305) from among the symbols coded previously. Alternatively, it is possible to consider all the symbols coded previously and not only the close symbols. However, the use of such a set of symbols leads to a high number of evaluations of which some have little chance of resulting in sequences that are worthwhile to code. Consequently, it may be allowed that, for example, only the symbols of which the start of the numbers that they represent corresponds to that of the number represented by the symbol S have to be taken into consideration. Furthermore, knowing that the identical or close (small difference) symbols are searched for, it is preferable to group together the numerical symbols.

Such grouping together may be carried out in different ways. According to a first embodiment, it is possible to create classes of close symbols, the classes not being separate. It is for example advantageous to group together the symbols by prefix or by prefix and length. According to this example, all the symbols starting with "5" or all the symbols starting with "5" and of length "3", for example "542" and "561" are group together. In this way, it is possible to easily access the class of close symbols on the basis of a given number and any close symbol may be identical to the symbol considered.

It is also possible, according to a second embodiment, to define a system of classes which overlap by managing, for example, prefixes of different lengths. According to this example, a class for the symbols commencing with "5" and another class for the symbols commencing with "50" are used, the second class being contained within the first. Such a class system enables the similarity searched for to be adjusted on the basis, in particular, of the number of close symbols identified. The class of the close symbols may be reduced by taking into account an additional character in the prefix. As previously, it is also possible to take into account the length of the symbols in the class system.

Lastly, a third embodiment consists of sorting the symbols already coded. Thus, when close symbols are searched for a given symbol, the set of the close symbols is constituted by all the symbols for which the difference is less than a given threshold, it being possible for that threshold to be defined absolutely or according to the value of the numbers. It is also possible to fix a threshold for the number of close symbols in order to limit the cost of the search for the best sequence.

Whatever the embodiment, a limit on the number of symbols already coded to take into account for identifying the close symbols may be set according to the distance separating the position of those symbols already coded and that of the symbol to code, which corresponds to the definition of a sliding window in which the close symbols are determined. The definition of a window makes it possible to put a bound on the indices to code and limit the calculations necessary for the search for similar sequences.

The addition of a symbol to a group of close symbols may be carried out just after the coding of that symbol. In this way, it is possible to make a reference to any symbol of a group of close symbols since they are all already coded. Furthermore, it is preferable to add all the coded symbols to groups of close symbols in order to increase the chances of finding advantageous sequences. If a sequence of Match type is coded, all the numerical symbols covered by that sequence are preferably added to the groups of close symbols.

For the set EP of close symbols determined, a test is carried out to determine whether a close symbol SP remains unprocessed (step 310), that is to say to determine whether at least one close symbol remains for which the sequences comprising it have not been determined. If at least one close symbol SP remains unprocessed, the sequences for S and SP are searched for (step 315) then the test aiming to determine whether a close symbol SP that is unprocessed remains (step 310) is again carried out. The search for the sequences for S and SP is described in detail with reference to FIG. 4.

When all the close symbols have been processed, the best sequence is selected (step 320) by comparison in terms of coding efficiency.

As described previously, it is possible to compare sequences of different types by using the number of characters represented and the number of bytes required to code each sequence, these numbers making it possible to determine the most efficient sequence.

An advantageous variant consists of defining, for each type of sequence, a best sequence initially indeterminate, and of updating those best sequences further to the search for sequences for the symbols S and SP (step 315). This is because, by selecting the best sequence of each type, for example according to their properties such as the length for a sequence of Match type, the number of sequences to compare at the time of selecting the best sequence is reduced, which enables more efficient processing.

Thus, for example, if the close symbols $SP_1$, $SP_2$ and $SP_3$ are processed for a symbol S, the best sequence of Match type is initially indeterminate, no close symbol having been processed. If $SP_1$ enables a sequence of Match type to be found having a length of 4 symbols, then the best sequence of Match type is updated with that sequence. Next, if for $SP_2$ a sequence of Match type having a length of 3 symbols is found, the best sequence of Match type is not updated since the length is less than that of the best sequence of Match type encountered up till then. On the other hand, if a sequence of Match type having a length of 6 symbols is identified for $SP_3$, the best sequence of Match type is updated with that sequence starting with $SP_3$ and having a length of 6 symbols. This sequence thus becomes a first sequence, identical to a second sequence of which the first symbol is the symbol S.

In similar manner, a best sequence of Delta type is determined as detailed below and becomes a third sequence that is a candidate for the coding by reference. This third sequence has at least one difference with a fourth sequence comprising the symbol S.

Thus, only the best sequence for each type of sequence is stored in memory and it is not necessary to store all the sequences identified to compare them at the end of processing.

The best sequence obtained is coded (step 325).

Figure 4:
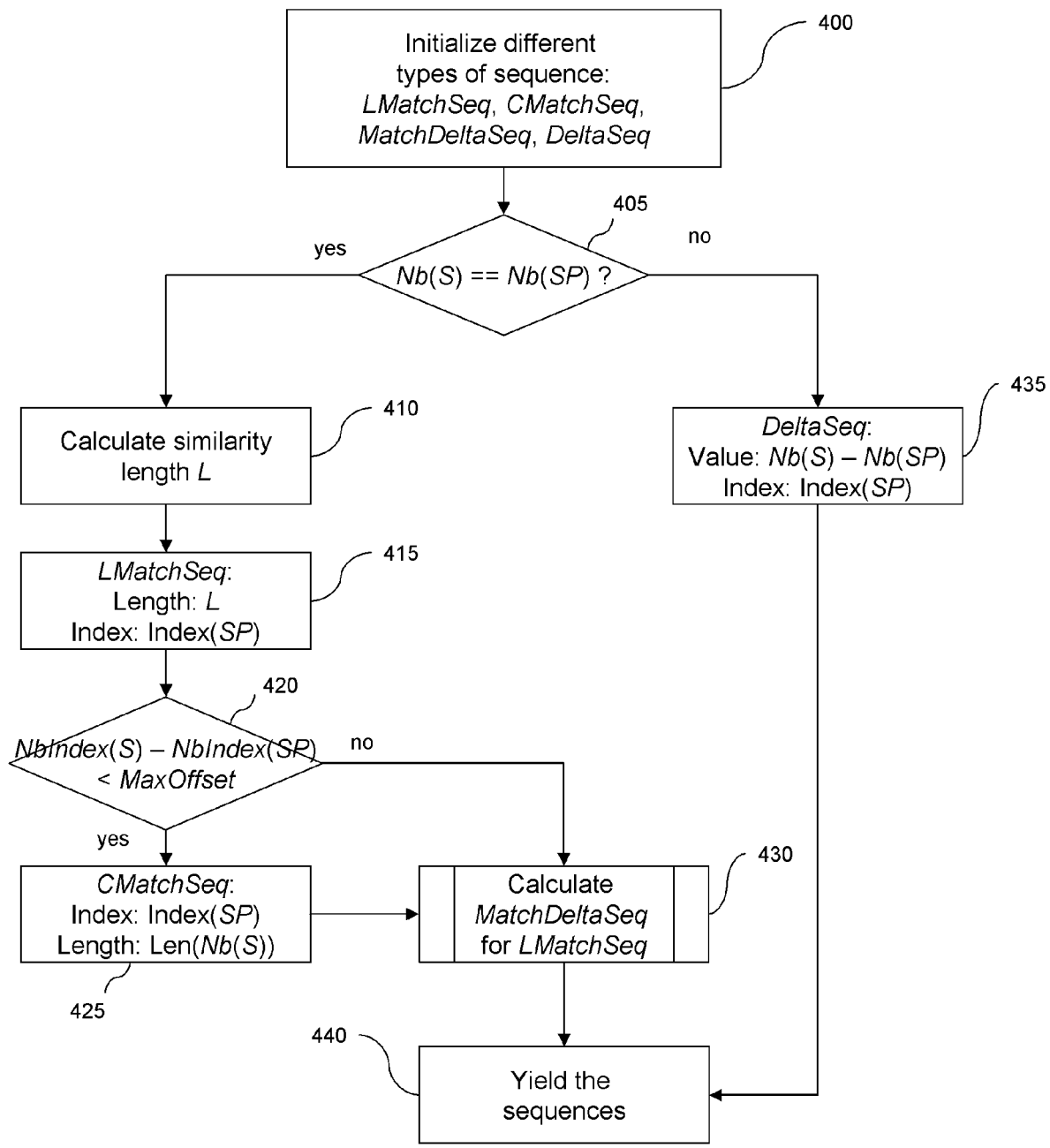
FIG. 4 illustrates an algorithm example for searching for sequences for a symbol S and for a close symbol SP.

FIG. 4 illustrates an algorithm example for searching for sequences for a symbol S and for a close symbol SP.

The search for sequences for a symbol S and for a close symbol SP commences with the initialization of the different sequences searched for (step 400). It is provided here to search for the longest sequence of Match type, termed LMatchSeq, a sequence of Match type sufficiently close in terms of offset in the list of symbols, termed CMatchSeq, a sequence of Delta type, termed DeltaSeq and the longest sequence MatchDelta, termed MatchDeltaSeq.

The numbers Nb(S) and Nb(SP) are then compared (step 405), a number Nb(x) being determined in the following manner: if a symbol x represents the integer part of an integer number, x and Nb(x) are equal and if the symbol x represents the integer part of a decimal number, Nb(x) is equal to the number resulting from the concatenation of the symbol x and the following symbol, that is to say the symbol representing the decimal part.

If the numbers Nb(S) and Nb(SP) are equal, the length L of the sequence of identical symbols is calculated (step 410). To that end, the numbers $Nb(S_i)$ and $Nb(SP_i)$ are compared, representing the symbols $S_i$ and $Sp_i$ following the symbols S and SP. The value L is defined by the highest value j such that $Nb(S_j)$ is equal to $Nb(SP_j)$. The parameters of the sequence LMatchSeq are then determined (step 415). The parameters used here are the length L calculated beforehand and the index of the symbol SP representing the reference index. These parameters mean that the first sequence commencing at the index of SP and comprising L symbols is identical to the second sequence commencing at the index of S and also comprising L symbols.

A test is next carried out to determine whether the difference in the index of S as a number and the index of SP as a number is less than a predetermined threshold, termed MaxOffset (step 420). By way of illustration, such a threshold may be set at five which makes it possible to form short references to the four most recently coded numbers. This is particularly useful in the case of data of two or three dimensions since it is frequent that one of the coordinates is invariable.

If that difference is less than the threshold MaxOffset, this means that the sequence corresponding to Nb(SP) is a close (situated nearby) identical sequence. It is possible that the symbols following those corresponding to Nb(S) and to Nb(SP) are identical, the sequence thus potentially being longer. However, in the context of the sequence CMatchSeq ("close Match"), only the sequences relative to Nb(S) and to Nb(SP), having a length of two symbols at most, are taken into account to efficiently code a repetition of a number that appeared in a recent past. It is thus advantageous, to obtain better efficiency, only to code an index and not a length, the latter being determined on the basis of the number to which reference is made.

For example, considering the data "1.5 2 1.5", with this type of sequence, the second number "1.5" is coded as "close Match" with the backward index 2. During the decoding, it is thus possible to obtain the symbol "1" then to verify the following symbol ("0.5"). The latter represents a decimal part. However, Nb(S) is equal to Nb(SP). Consequently, if Nb(S) has a decimal part, Nb(SP) also has a decimal part. The symbol "0.5" is thus added. The second number "1.5" is thus decoded without the length having been coded.

Sequences of CMatchSeq type and of LMatchSeq type must here be coded differently (one bit may, for example, be used to indicate a "close Match" sequence, for which the length is implicit).

The sequence CMatchSeq may then be parameterized (step 425). The index of the symbol SP is necessarily taken into consideration. It may also be advantageous to consider the length of the sequence. This is because, even if the latter is implicit, it may be worthwhile to take it into account on coding to be able to process that type of sequence as a sequence of conventional Match type. In this way, the processing of these two types of sequences is common with the exception of the coding step (the length not having to be coded for a sequence of close Match type).

If the difference of the index of S as a number and of the index of SP as a number is greater than the threshold MaxOffset or after having parameterized the sequence CMatchSeq, the sequence MatchDeltaSeq is determined on the basis of the sequence LMatchSeq (step 430). This step is detailed with reference to FIG. 5.

If the numbers Nb(S) and Nb(SP) are not equal, the sequence DeltaSeq is parameterized (step 435) with the corresponding difference, that is to say the value equal to the difference between those numbers (Nb(S)-Nb(SP)), and the index of the symbol SP for reference.

It should be remarked that, in similar manner to what is done at step 430, it is possible, further to step 435, to make a search for difference between the numbers which follow Nb(S) and Nb(SP). The length of the sequence is then determined by comparing the numbers Nb($S_i$) and Nb($SP_i$) corresponding to the symbols $S_i$ and $SP_i$ following the symbols S and SP. The method described with reference to FIG. 5 may be applied here, the only difference coming from the fact that it is necessary to start from a sequence of Delta type and not from a sequence of Match type. The fact of taking into account a sequence of this type leads to providing, in the coding of the series of differences, a marker making it possible to know if differences follow. However, according to the forms of coding defined and the data processed, it is not always worthwhile to take into account this type of sequence.

More generally, various types of sequences may be searched for in addition to the types already described, in particular combinations of identities and differences, sequences in which only the signs are liable to change, or sequences of differences with several dimensions. For example, in the sequence "1 2 3; 11 12 13" there appears a point in three dimensions for which the value "10" has been added to each coordinate. However, the greater the number of different types of sequences that are considered, the more costly is the processing and the longer the codes have to be to distinguish the different type of sequence.

The determination of the sequence DeltaSeq or MatchDeltaSeq makes it possible to determine at least one sequence, termed third sequence, of which at least one symbol is distinct from the symbol corresponding to a fourth sequence of symbols to code comprising the symbol S.

In a variant, if the numbers Nb(S) and Nb(SP) are decimal numbers, sequences of Match type are searched for the symbols corresponding to their respective decimal parts, that is to say the symbols which follow the symbols S and SP. Next, to determine the cost of coding Nb(S), the coding of S and that of the following symbol (for example with coding of Number type for S and coding of Match type or the following symbols) are cumulated. The advantage of proceeding in this manner comes from the fact that there are higher chances of finding long sequences of Match type. However, in order for that sequence to be advantageous, the cost associated with the coding of S alone must not be too high.

In another variant, the differences for decimal numbers are taken into consideration only if the integer parts are equal. In this manner, less information is to be coded and the differences obtained thus have greater chance of proving to be advantageous.

After having been identified, the different sequences are transmitted to the algorithm described with reference to FIG. 3 (step 440) to enable the selection of the best sequence.

Figure 5:
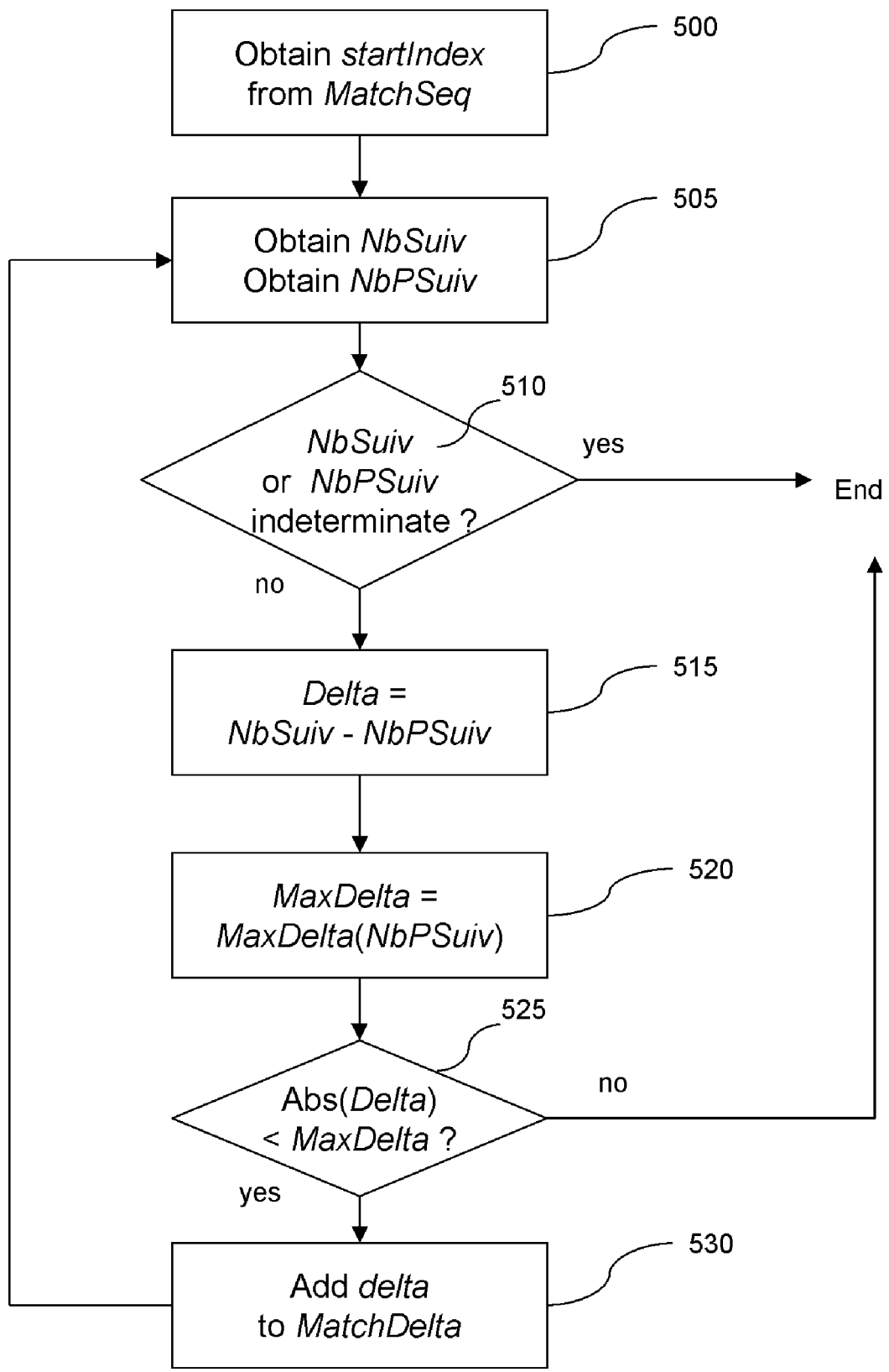
FIG. 5 illustrates an algorithm example for determining sequences whereby some symbols are identical and others close, on the basis of a sequence of identical symbols.

FIG. 5 illustrates an algorithm example for determining sequences of MatchDelta type on the basis of a sequence MatchSeq.

The evaluation of a sequence of MatchDelta type on the basis of a sequence of Match type starts with the obtainment of start indices for the sequence to code and for the sequence to which reference is made to code it (step 500). Considering a symbol S and a close symbol SP, with a Match length L, these start indices for the evaluation of the differences are respectively (Index(S)+L) and (Index(SP)+L).

Next determination is made (step 505) of the next numbers NbSuiv and NbPSuiv to appear in the data to code, NbSuiv following the sequence starting with S and NbPSuiv following the sequence starting with SP. It may be that the data which follow the determined indices are not numbers. If they are separators or signs, the following number is searched for. If it is an SVG command or if the end of the data is reached, the search for the following number is interrupted and it is considered that this number is indeterminate. This is because when seeking to add differences after the sequence of identical symbols, only numbers (to which may be attached separators and signs but not commands) are taken into consideration. It should be remarked that for the sequences of MatchDelta type, it is more advantageous to re-arrange the order of the data to separate the commands from the numbers as indicated previously in order for a sequence of deltas not to be interrupted by a command.

A test is then carried out to determine whether the numbers NbSuiv or NbPSuiv are indeterminate (step 510). If the numbers NbSuiv or NbPSuiv are indeterminate, no difference can be calculated and the processing ends. If the numbers NbSuiv and NbPSuiv are not indeterminate, their difference (NbSuiv−NbPSuiv), termed delta, is evaluated (step 515). To know whether it is advantageous to code this difference, a value, termed MaxDelta, below which it is advantageous to add the difference to the sequence of MatchDelta type in course of determination, is, preferably, evaluated (step 520). Typically, if the cost of coding that difference is less than that of the coding of the number NbSuiv as a number, that is to say by using a sequence of Number type, it is preferable to add that difference to the sequence. As NbSuiv is known, it is possible to determine the number of bytes necessary to code it, and, on the basis of that information, to determine the greatest difference that may be coded over a smaller number of bytes.

By way of illustration, if the number NbSuiv has the value 520.5, it may be considered that three bytes are necessary to code it (two bytes for the value 5205 and one byte for the format, that is to say the number of bytes used to code the value, the position of the point and the sign). This means that the coding in delta form is advantageous if it is possible to code that value over two bytes at maximum. If four header bits are used to code those differences (sign of the number, sign of the difference and other indications of format), this means that twelve bits remain for coding the value and thus that the difference must be less than 4096. This is just an example here, it being possible to use other solutions to code the differences.

To know the size of the data to write, several approaches are possible. A first solution consists of using indications of format in the header of the coded delta: if the differences are coded over one or two bytes, one bit suffices to indicate whether the value of the difference is coded over one or two bytes. Another solution consists of making the length implicit by defining it by virtue of the number NbPSuiv (when the data are decoded, the number NbPSuiv is known, it is thus possible to calculate, on the basis of that number, the greatest authorized difference which makes it possible to know how many bytes have to be read (in this case the number NbPSuiv is used to determine the value MaxDelta on coding).

A test is then carried out to determine whether the absolute value of the difference delta is less than MaxDelta (step 525). If the absolute value of the difference delta is less than MaxDelta, the difference delta is added to the sequence MatchDelta (step 530) and the algorithm loops starting from the step of obtaining the numbers NbSuiv and NbPSuiv (step 505) to obtain the following numbers to process. If the absolute value of the difference delta is greater than MaxDelta, the processing ends. The sequence of MatchDelta type has been determined.

The coding system described with reference to FIGS. 1 to 5 is thus adapted to, decompose the data into symbols;

select a first set of symbols to code;

find at least one identical set of symbols among the coded symbols, that set being identical to a first subset of the first set;

find at least one similar set of symbols among the coded symbols, that set corresponding to a second subset of the first set and for which at least one symbol is different; and, select an identical set or a similar set to code a part of the first set, the selection being based on an optimization criterion, typically the coding cost or the coding efficiency as explained above.

Figure 6:
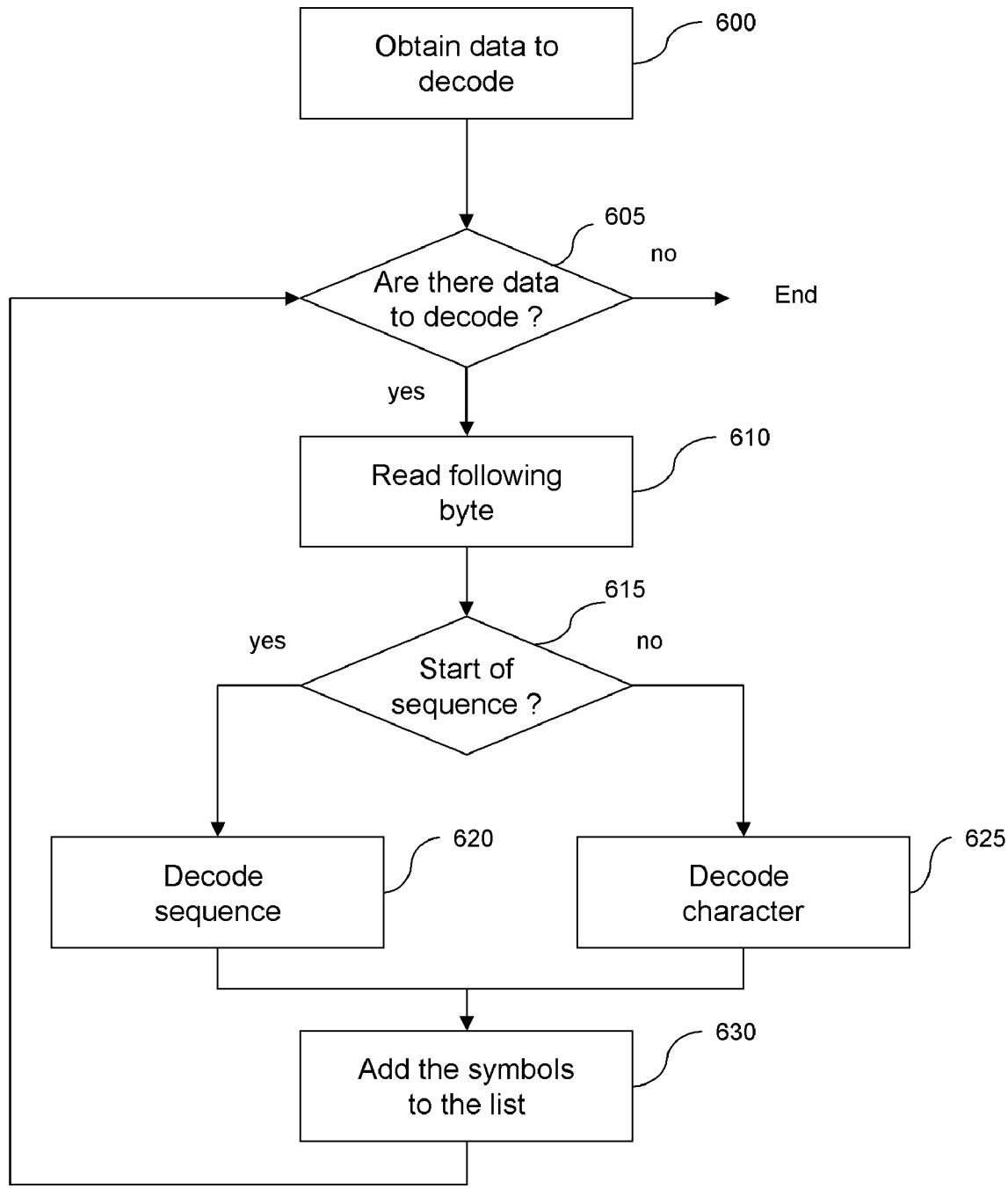
FIG. 6 illustrates an algorithm example for decoding data coded using the algorithm illustrated in FIG. 2; and, FIG. 7 shows an example of a device making it possible to implement the invention at least partially.

FIG. 6 illustrates an algorithm example for decoding data coded according to the algorithm for binary coding by similarities described previously.

The object of a first step it the obtainment of data to decode (step 600). A test is then carried out to determine whether data to decode remain (step 605). If data to decode remain, the following byte in the data to decode is read (step 610) and a test is carried out to determine whether it is the start of a sequence (step 615).

If it is the start of a sequence, the sequence is decoded (step 620). The decoding of a sequence commences with the decoding of a header, which makes it possible to determine the type of sequence to decode. In particular, by virtue of the type, it is possible to know whether the data are directly decodable or if their decoding requires reference to be made to the data decoded beforehand. In the case of a sequence of Number type, the data may be decoded only on the basis of the coded bytes. On the other hand, for the other types of sequence, a reference is made to the data decoded beforehand. It is thus necessary to read, in advance, the data to decode then to reconstruct the sequence or list of symbols on the basis of the data read and the data decoded beforehand. In the case of a sequence of Match type, for example, a number making it possible to determine the reference symbol is decoded (for example its index in the list of symbols), as well as another number giving the length of the sequence of similar symbols from the reference symbol.

When the sequence is decoded, the symbols are added to the list of decoded symbols (step 630) in order to have the same list of symbols as on coding. When a number is decoded, it may be necessary to add two symbols, one for the integer part and one for the decimal part. Similarly, if a number is negative, "−" should be added as a separate symbol. Lastly, according to the coding conventions, it may also be necessary to add a separator after each number.

If the following byte determined at step 610 is not a start of sequence (step 615), this means that that byte corresponds to a character alone, for example an SVG path command. That byte is then decoded conventionally, the value of the byte being the code associated with a character (step 625). This character is then added to the list of the symbols (step 630).

After having added the symbols to the list of the symbols (step 630), the algorithm determines whether data remains to decode (step 605). The algorithm terminates when there is no more data to decode, the list of the symbols representing the decoded data.

The decoding system described with reference to FIG. 6 is thus adapted to, decode the coded data with a reference to a set of symbols; and, on the basis of the decoded data, reconstitute the list of symbols resulting from the dividing up of the data into symbols on coding.

Figure 7:
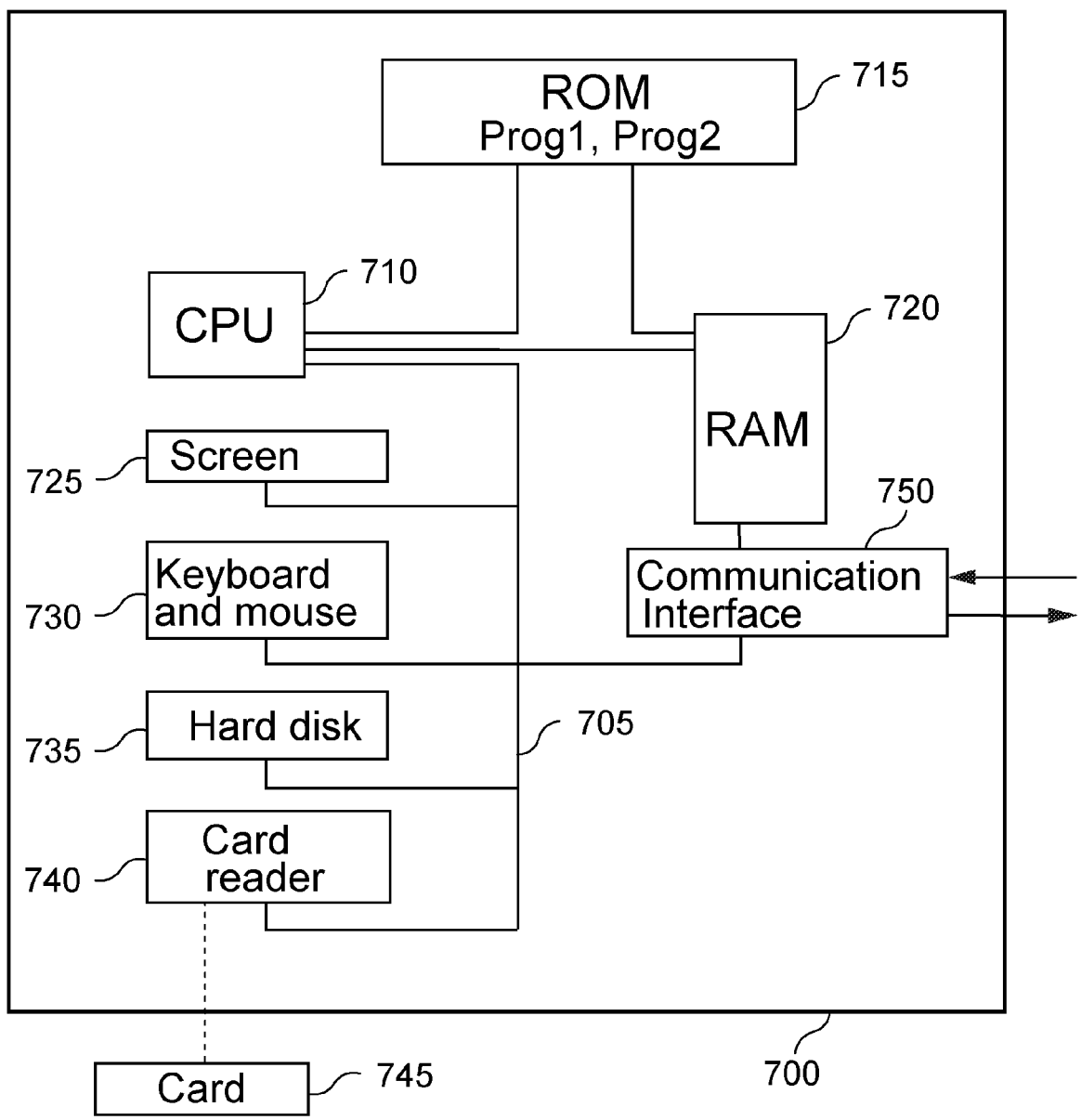

A device adapted to implement the invention or a part of the invention is illustrated in FIG. 7. The device 700 is for example a workstation, a micro-computer, or a personal digital assistant.

The device 700 here comprises a communication bus 705 to which there are connected:

a central processing unit (CPU) or microprocessor 710;

a read-only memory (ROM) 715 able to contain the programs "Prog1" and "Prog2";

a random access memory (RAM) or cache memory 720, comprising registers adapted to record variables and parameters created and modified during the execution of the aforementioned programs; and, a communication interface 750 adapted to transmit and to receive data.

Optionally, the device 700 may also have:

a screen 725 making it possible to view data and/or serving as a graphical interface with the user who will be able to interact with the programs according to the invention, using a keyboard and a mouse 730 or another pointing device, a touch screen or a remote control;

a hard disk 735 able to contain the aforementioned programs "Prog1" and "Prog2" and data processed or to be processed according to the invention; and, a memory card reader 740 adapted to receive a memory card 745 and to read or write thereon data processed or to be processed according to the invention.

The communication bus allows communication and interoperability between the different elements included in the device 700 or connected to it. The representation of the bus is non-limiting and, in particular, the central processing unit may communicate instructions to any element of the device 700 directly or by means of another element of the device 700.

The executable code of each program enabling the programmable device to implement the methods according to the invention may be stored, for example, on the hard disk 735 or in read only memory 715.

According to a variant, the memory card 745 can contain data as well as the executable code of the aforementioned programs which, once read by the device 700, is stored on the hard disk 735.

According to another variant, it will be possible for the executable code of the programs to be received, at least partially, via the interface 750, in order to be stored in identical manner to that described previously.

More generally, the program or programs may be loaded into one of the storage means of the device 700 before being executed.

The central processing unit 710 will control and direct the execution of the instructions or portions of software code of the program or programs according to the invention, these instructions being stored on the hard disk 735 or in the read-only memory 715 or in the other aforementioned storage elements. On powering up, the program or programs which are stored in a non-volatile memory, for example the hard disk 735 or the read only memory 715, are transferred into the random-access memory 720, which then contains the executable code of the program or programs according to the invention, as well as registers for storing the variables and parameters necessary for implementation of the invention.

It should be noted that the communication apparatus comprising the device according to the invention can also be a programmed apparatus. This apparatus then contains the code of the computer program or programs for example fixed in an application specific integrated circuit (ASIC).

By way of illustration, an example is presented here of coding of the following SVG string, from an SVG path, according to the algorithm described with reference to FIGS. 1 to 6, "M0 45.0 c46.5 200–45.0 46.5 46.5 210"

As stated previously, this SVG string comprises two types of data, the symbols of numerical data and the others. A symbol of numerical data may be a number, for example "0" or "45.0", or a portion of a number (distinction between the integer and decimal parts), for example "45" and "0.0". The characters not belonging to a number, including the signs, are considered as constituting symbols by themselves.

A first step consists of re-arranging the order of the data by collecting together the SVG commands at the start then the numbers afterwards. Although this step is not required to implement the invention, it enables better results to be obtained. This processing enables the following string to be obtained, "Mc0 45.0 46.5 200–45.0 46.5 46.5 210"

It should be remarked that as the number of parameters for each command is fixed, the fact of re-arranging the order of the data and of the numbers in this way does not give rise to any loss of information.

In this manner, tighter constraints are imposed on the data (first of all commands, then data), which enables the data to be coded more efficiently. For example, it is not necessary to keep a range of codes for the commands in order to code the numbers, since no command is encountered within the numbers.

Table 1 appended hereto illustrates the symbols obtained for the processed string. This table is aimed solely at illustrating how the string to process is divided into symbols and not to describe a first step in which all the symbols would be determined before proceeding with the coding of the data (the invention does not require all the symbols to be obtained before being able to commence coding of the data).

The commands are first of all coded. For this, it is possible to code the number of commands, that is to say two here, then to code the commands. Given the small number of commands defined by SVG, it is possible to code each command over five bits. More advantageously, it is possible to give precedence to the most frequent commands in order to give them a shorter code. Here, if the commands "M" and "c" are associated with codes of four bits, it is possible to code these two commands over a single byte.

The following symbol, that is to say the symbol having the index 2, here "0", is obtained next. Given that it is the first number, it is not possible to search for similar sequences. The symbol is thus coded as a sequence of "Number" type (sequence with a single symbol).

The coding format for the numbers used here is of the 1BCD WXYZ type where, 1 is the identifier of the coding format for a sequence of Number type;

B represents the sign of the coded number;

C gives the nature of the number coded (integer or decimal); and,

D WXYZ represents the format of the number followed by a description of the format that is to say the number of bytes used and the position of the point, followed by the coded number if the number is decimal or of the coded number if the number is an integer.

Thus, the coding of "0" is "1001 0000" where B=0 (positive number), C=0 (integer number), D=1 (short integer) and WXYZ=0000 (value "0").

The following symbol (having the index 3) is constituted by a single character, a space, used as a separator. A separator of this type after a number is present in practically all cases, and it is not therefore necessary to code it (to reconstitute the original string at the decoding phase, it suffices to add such a separator after each number—in the worst case, a superfluous separator is added, but this does not change the information contained in the string with regard to SVG).

The following symbol (having the index 4) is the number "45" here, which is grouped together with the following symbol "0.0" (having the index 5) in order to obtain the number "45.0". To determine the symbols, it is advantageous to distinguish between the integer and decimal parts in order to have a finer level of granularity to compare the sequences, however, to code a number, it is rarely worthwhile to make this distinction.

To code the number "45.0", a sequence of Number type or a similar sequence, of Match or Delta type, may be used. It is possible to search for similar sequences on the basis of any number coded previously, however it is generally more advantageous to restrict consideration to close numbers, these numbers having a greater chance of leading to similar sequences. A simple criterion of proximity may be a common prefix and a common length (number of characters) Here, the only number coded previously is "0" and it is considered that it is not close to the value "45.0". Consequently, no similar sequence search is carried out. The number is thus coded as a sequence of Number type.

Thus the coding of "45.0" is "1010 0001 0000 0001 1100 0010" where B=0 (positive number), C=1 (decimal number), D=0 (short decimal), WX=00 (a decimal), YZ=01 (value over 2 bytes) followed by the value 0000 0001 1100 0010 (value "450").

The following symbol (having the index 6) is a separator, it is thus not necessary to code it.

The following symbol (having the index 7) is the number "46" here, which is grouped together with the following symbol "0.5" (having the index 8) in order to obtain the number "46.5". There exists a close symbol ("45") that has already been coded which forms the number "45.0" with the symbol that follows it. It is thus possible to search for a similar sequence. As the two numbers are different, the search for a sequence of Match type representing a series of identical symbols is eliminated. On the other hand, a sequence of Delta type representing a difference between two close numbers is possible. The difference has the value "1.5" and the two numbers follow each other immediately, that is to say that there is zero offset between the two numbers.

In order to determine whether it would be better to code a sequence of Delta type or a sequence of Number type, it is necessary to compare the number of characters represented and the number of bytes required. In both cases, five characters are represented, that is to say the four of the number plus the separator. With a sequence of Number type, three bytes are necessary. With a sequence of Delta type, only two bytes are necessary. It is thus this sequence which is advantageously chosen. The choice of course depends on the coding formats defined. This is only an example here, other coding formats for which the sequence of Number type would be more advantageous than the sequence of Delta type could be found. The definition of the coding formats does not come from the invention. In particular, in this example, the coding of the differences does not require the number of decimals to be stated since it is assumed that two close numbers have the same number of decimals.

The coding format used here to represent a sequence of Delta type is of the type 001D WXYZ where, 001 is the identifier of the coding format of a sequence of Delta type;

D identifies the sign;

W identifies the sign of the difference; and,

XYZ represents the format, that is to say here the offset relative to the reference number, the number of bytes for the difference (delta) and the value of the difference.

Thus, the coding of "46.5" is "0010 0000 0000 1110" where D=0 (positive number), W=0 (positive difference), X=0 (value of the difference coded over one byte), YZ=00 (offset relative to the preceding symbol), followed by the byte 0000 1110, representing the integer value of the difference (15) less one (one is the smallest possible difference since the difference has the value zero when there is no sequence of Delta type but a sequence of Match type.

The following symbol to code (having the index 10) is "200". There is thus no close number already coded. This symbol is thus coded according to the Number type.

The coding of "200" is "1000 0000 1100 1000" where B=0 (positive number), C=0 (integer number), D=0 (long integer), WXZ=0000 (number of bytes to read-1) followed by the value 1100 1000 (value "200").

The following two symbols (having the indices 11 and 12) are not coded. The following symbols (having the indices 13 and 14) forming the number "45.0" are thus read. There are two close numbers already coded, "45.0" (index 4 and 5) and "46.5" (index 7 and 8). For the first number, there is equality between the numbers, and a sequence of Match type may thus be obtained. The symbols following the processed symbols, that is to say the symbols " ", "46", "0.5" and " " (having the indices 15 to 18) are thus analyzed and compared to the symbols following the one used as reference for the sequence. They are identical here. A sequence of Match type having a length 6 with an offset of 2 relative to the number which serves as reference (two numbers between the two occurrences of "45.0", i.e. "46.5" and "200"). The other coded numbers have the value "200" in one case and "46.5" in the other. As the difference is great, a sequence of MatchDelta type (coding of differences after a sequence of identical symbols) is not searched for.

The other close number coded beforehand ("46.5") is different, and a sequence of Delta type may be used. The difference is −1.5, with an offset of 1. Such a difference may be coded over 2 bytes.

It is then necessary to compare the different sequences with each other.

three bytes are necessary to code the sequence of Number type;

two bytes are necessary to code the sequence of Delta type; and two bytes are necessary to code the sequence of Match type;

The sequence of Match type is that which represents the most coded characters, it is thus this sequence which is chosen.

The coding format used here to represent a sequence of Match type is of the type 01CD WXYZ where, 01 is the identifier of the coding format of a sequence of Match type;

C specifies whether coding by difference follows the coding by identity;

D identifies the sign;

W specifies the format of the similarity; and,

XYZ represents the format, that is to say here the number of similar symbols and the offset relative to the reference symbol.

Thus, the coding of "−45.0 46.5" is "0101 1101 0000 0010" where C=0 (single similarity, without difference), D=1 (first number negative), W=1 (compact similarity, length over XYZ, offset over the following byte), XYZ=101 (length of 6 symbols) followed by the offset 0000 0011 (offset by two numbers).

The following symbol (having the index 19) forms the number "46.5" with the symbol which follows it (having the index 20). There are four close numbers already coded. Without detailing the study of each of those numbers, it may be seen that there is no sequence of Match type which covers more symbols than the number itself and the separator which follows it. On the other hand, there is a sequence of MatchDelta type relative to the sequence "46.5 200". More particularly, there is first of all a sequence of identical symbols ("46.5") then two close numbers "200" and "210". It is thus worthwhile to code a sequence of MatchDelta type, which describes first of all an identity ("46.5") then differences (here a single one having the value 10). This sequence may be coded over three bytes. This is the most efficient sequence.

Thus, the coding of "46.5 210" is "0110 1010 0000 0011 1000 1001" where C=1 (single similarity followed by differences), D=0 (first positive number), W=1 (compact similarity, length over XYZ, offset over the following byte), XYZ=010 (length of 3 symbols) followed by the offset 0000 0011 (offset by three numbers) and lastly the delta, according to the format ABCD WXYZ where A indicates that this delta is the first delta, B designates the sign of the number, C the sign of the delta, and D WXYZ the value of the delta. This is the last delta (A=1) here, the number is positive (B=0), as is the delta (C=0) and the value of the delta is 10 (the value 9 is coded given that the smallest delta has the value 1).

All the data have been coded, and the processing ends. In this example, a particular type of Match sequence has not been taken into account: a sequence of "close" Match type in which the closest similar sequence is searched for (for such a sequence the length is not taken into account, only the closest occurrence of the same number is searched for). This type of sequence could be used between the different occurrences of the numbers "45.0" or "46.5". The value of this type of sequence is to be able to efficiently code any number having recently been coded (typically code over one byte a number from among the last four coded).

The method according to the invention may also be applied to other languages for description of graphics in two dimensions in XML, such as Microsoft Silverlight (Silverlight is a trademark) or Adobe Mars, or using other syntaxes, such as Adobe Postscript (Postscript is a trademark), Adobe PDF (PDF is a trademark) or Autodesk DXF (DXF is a trademark). It may also be applied to graphical interface description languages, such as XAML (acronym for eXtensible Application Markup Language), XUL (acronym for XML-based User interface Language), UIML (acronym for User Interface Markup Language), Adobe Flex (Flex is a trademark) and OpenLaszlo. It may furthermore be applied to languages enabling multimedia descriptions, in particular to code lists of temporal values. These languages include SMIL (acronym for Synchronized Multimedia Integration Language). Lastly, it may be applied to languages for graphical description in three dimensions, in particular to code lists of points in three dimensions. These languages include for example X3D (acronym for Extensible 3D).

Naturally, to satisfy specific needs, a person skilled in the art will be able to make amendments to the preceding description.

Annex

TABLE 1

| | Index | | | | | | | | | | |
|---|---|---|---|---|---|---|---|---|---|---|---|
| | 0 | 1 | 2 | 3 | 4 | 5 | 6 | 7 | 8 | 9 | 10 |
| Symbol | M | c | 0 | | 45 | .0 | | 46 | .5 | | 200 |
| | Index | | | | | | | | | | |
| | 11 | 12 | 13 | 14 | 15 | 16 | 17 | 18 | 19 | 20 | 21 | 22 |
| Symbol | — | | 45 | .0 | | 46 | .5 | | 46 | .5 | | 210 |

The invention claimed is:

1. A method of binary coding by similarities for a structured document comprising at least one plurality of data to code, the method comprising the following steps,
   decomposing (115,135,140) said plurality of data to code into a series of symbols, each item of data of said plurality of data being at least partly represented by a symbol of said series of symbols;
   selecting (210) at least one item of data in said plurality of data to code;
   searching (315) for at least one first sequence of symbols coded beforehand, said first sequence being identical to a sequence of symbols to code, termed second sequence, comprising at least one symbol representing at least one part of said at least one selected item of data, termed processed symbol;
   searching (315) for at least one third sequence of symbols coded beforehand, at least one symbol of said third sequence being distinct from the symbol corresponding to a sequence of symbols to code, termed fourth sequence, comprising at least said at least one processed symbol;
   comparing (320) the coding efficiency of said second and fourth sequences, said second sequence being coded relatively to said first sequence and said fourth sequence being coded relatively to said third sequence according to the difference between said at least one processed symbol and said corresponding symbol of said third sequence; and,
   in response to said comparison, coding (325) said second sequence or said fourth sequence.

2. A method according to claim 1, further comprising a step (305) of comparing said at least one processed symbol with a plurality of symbols coded beforehand and a step of selecting a symbol coded beforehand, identical to said at least one processed symbol, said selected symbol belonging to said first sequence.

3. A method according to claim 2 further comprising a step of grouping together the symbols coded beforehand, the coded symbols being grouped such that the symbols of the same group are close to each other.

4. A method according to claim 3 in which said grouping step comprises a step of grouping by prefix or a step of grouping by prefix and by length of the prefix.

5. A method according to claim 1, further comprising a step (305) of comparing said at least one processed symbol with a plurality of symbols coded beforehand and a step of selecting a symbol coded beforehand, close to said at least one processed symbol, said selected symbol belonging to said third sequence.

6. A method according to claim 5 further comprising a step of grouping together the symbols coded beforehand, the coded symbols being grouped such that the symbols of the same group are close to each other.

7. A method according to claim 1 further comprising a step of selecting a first sequence from a plurality of sequences satisfying the search criterion for said at least one first sequence and/or of selecting a third sequence from a plurality of sequences satisfying the search criterion for said at least one third sequence, prior to said step (320) of comparing the coding efficiency of said second and fourth sequences.

8. A method according to claim 7 in which said step of selecting a sequence from a plurality of sequences, or at least one of said steps of selecting a sequence from a plurality of sequences, comprises a step of determining the distance between the position of the first symbol of each of the sequences of said plurality of sequences and the position of said processed symbol and a step of comparing said distance with a predetermined threshold.

9. A method according to claim 1 in which at least one item of data from said plurality of data is a decimal number, the integer part of said decimal number being represented by a first symbol and the decimal part of said decimal number being represented by a second symbol.

10. A method according to claim 1 in which at least one item of data from said plurality of data is a number, the sign of said number being represented by a first symbol and the absolute value of said number being represented by at least one second symbol.

11. A method according to claim 1 further comprising a prior step of re-organizing the data of said plurality of data according to the nature of said data.

12. A method according to claim 1 in which said step of comparing the coding efficiency of said second and fourth sequences comprises a step of comparing the amount of data represented by said second and fourth sequences before and after coding.

13. A method of binary decoding for a structured document comprising at least one plurality of coded data, the method comprising the following steps,
- obtaining said plurality of coded data;
- selecting (610) at least one item of coded data in said plurality of coded data;
- determining (615) the coding format of said at least one selected item of data from a plurality of predetermined coding formats, at least one coding format being of the "coding by identical references" type and at least one coding format being of the "coding by references with at least one difference" type; and,
- in response to said determining step, decoding (620, 625) said at least one selected item of data according to a list of symbols comprising at least one item of data decoded beforehand.

14. A method according to claim 13 further comprising a step (630) of adding decoded data during said decoding step to said list of symbols.

15. A computer program stored on a readable medium comprising instructions adapted for the implementation of each of the steps of the method according to claim 1 or claim 13 when said program is executed on a computer.

16. A non-transitory information storage means, removable or not, partially or totally readable by a computer or a microprocessor containing code instructions of a computer program for executing each of the steps of the method according to claim 1 or claim 13.

17. A device for binary coding by similarities for a structured document comprising at least one plurality of data to code, the device comprising the following means,
- means for decomposing said plurality of data to code into a series of symbols, each item of data of said plurality of data being at least partly represented by a symbol of said series of symbols;
- means for selecting at least one item of data in said plurality of data to code;
- means for searching for at least one first sequence of symbols coded beforehand, said first sequence being identical to a sequence of symbols to code, termed second sequence, comprising at least one symbol representing at least one part of said at least one selected item of data, termed processed symbol;
- means for searching for at least one third sequence of symbols coded beforehand, at least one symbol of said third sequence being distinct from the symbol corresponding to a sequence of symbols to code, termed fourth sequence, comprising at least said at least one processed symbol;
- means for comparing the coding efficiency of said second and fourth sequences, said second sequence being coded relatively to said first sequence and said fourth sequence being coded relatively to said third sequence according to the difference between said at least one processed symbol and said corresponding symbol of said third sequence, respectively, and,
- means for coding said second sequence or said fourth sequence in response to said comparison.

18. A device according to claim 17 further comprising means for comparing said at least one processed symbol with a plurality of symbols coded beforehand and means for selecting a symbol coded beforehand, identical to said at least one processed symbol, said selected symbol belonging to said first sequence.

19. A device according to claim 17, further comprising means for comparing said at least one processed symbol with a plurality of symbols coded beforehand and means for selecting a symbol coded beforehand, close to said at least one processed symbol, said selected symbol belonging to said third sequence.

20. A device according to claim 18 further comprising means for grouping together symbols coded beforehand.

21. A device according to claim 20 in which said grouping means are adapted to group together symbols coded beforehand by prefix or by prefix and by length of prefix.

22. A device according to claim 17 further comprising means for re-organizing the data of said plurality of data according to the nature of said data.

23. A device according to claim 17 in which said means for comparing the coding efficiency of said second and fourth sequences comprise means for comparing the amount of data represented by said second and fourth sequences before and after coding.

24. A device according to claim 17 further comprising means for selecting a sequence from a plurality of sequences in order to select said first and/or said third sequence, said selecting means comprising means for determining the distance between the position of the first symbol of each of the sequences of said plurality of sequences and the position of said processed symbol and means for comparing said distance with a predetermined threshold.

25. A device for binary decoding for a structured document comprising at least one plurality of coded data, the device comprising the following means,
- means for obtaining said plurality of coded data,
- means for selecting at least one item of coded data in said plurality of coded data;
- means for determining the coding format of said at least one selected item of data from a plurality of predetermined coding formats, at least one coding format being of the "coding by identical references" type and at least one coding format being of the "coding by references with at least one difference" type;
- means for decoding said at least one selected item of data according to a list of symbols comprising at least one item of data decoded beforehand; and,
- means for adding to said list of symbols the data decoded by said decoding means.

* * * * *